United States Patent
Joung et al.

(10) Patent No.: US 9,991,320 B2
(45) Date of Patent: Jun. 5, 2018

(54) ORGANIC LIGHT EMITTING DIODE DISPLAY DEVICE AND ORGANIC LIGHT EMITTING DIODE THEREOF

(71) Applicant: LG DISPLAY CO., LTD., Seoul (KR)

(72) Inventors: SeungRyong Joung, Gimpo-si (KR);
ChangWook Han, Seoul (KR);
KangJu Lee, Goyang-si (KR);
Hongseok Choi, Seoul (KR); Hansun Park, Paju-si (KR); SoYeon Ahn, Seoul (KR); Seongsu Jeon, Gwangmyeong-si (KR); Wonhoe Koo, Goyang-si (KR); JeaHo Park, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days. days.

(21) Appl. No.: 15/274,827

(22) Filed: Sep. 23, 2016

(65) Prior Publication Data
US 2017/0084875 A1    Mar. 23, 2017

(30) Foreign Application Priority Data

Sep. 23, 2015   (KR) .................. 10-2015-0134674

(51) Int. Cl.
*H01L 27/32*   (2006.01)
*H01L 51/52*   (2006.01)

(52) U.S. Cl.
CPC ...... *H01L 27/3244* (2013.01); *H01L 27/3258* (2013.01); *H01L 51/5262* (2013.01); *H01L 51/5209* (2013.01); *H01L 51/5225* (2013.01)

(58) Field of Classification Search
None
See application file for complete search history.

(56) References Cited

U.S. PATENT DOCUMENTS 9,219,252 B2 *  12/2015  Nishimura .......... H01L 51/5275
2014/0306213 A1  10/2014  Sato et al.

FOREIGN PATENT DOCUMENTS

| JP | 2004-335470 A | 11/2004 |
|---|---|---|
| JP | P2013-127844 A | 6/2013 |
| KR | 10-2014-0033636 A | 3/2014 |
| TW | 201334252 A1 | 8/2013 |

* cited by examiner

*Primary Examiner* — Jack Chen
(74) *Attorney, Agent, or Firm* — Dentons US LLP

(57) ABSTRACT

There is provided an organic light emitting diode display device. The organic light emitting diode display device includes a substrate divided into an emission area and a non-emission area, an overcoating layer disposed on the substrate and including a plurality of micro lenses, a plurality of first electrode patterns disposed on the overcoating layer and spaced away from each other in the emission area, an organic emission layer disposed on the plurality of first electrodes, and a second electrode disposed on the organic emission layer.

11 Claims, 11 Drawing Sheets

FIG.10

|  | VOLTAGE | EFFICIENCY |
|---|---|---|
| COMPARATIVE EXAMPLE | 100% | 100% |
| EMBODIMENT | 101% | 114% |

ORGANIC LIGHT EMITTING DIODE DISPLAY DEVICE AND ORGANIC LIGHT EMITTING DIODE THEREOF

CROSS-REFERENCE TO RELATED APPLICATIONS

This application claims priority from Korean Patent Application No. 10-2015-0134674, filed on Sep. 23, 2015, which is hereby incorporated by reference for all purposes as if fully set forth herein.

BACKGROUND

Field of the Disclosure

The present disclosure relates to an organic light emitting diode, and more particularly, to a display device including an organic light emitting diode with improved light extraction efficiency.

Description of the Related Art

An organic light emitting diode display device is a self-light emitting display device and, unlike a liquid crystal display device, does not need a separate light source. Thus, the organic light emitting diode display device can be lightweight and have a compact size. Further, the organic light emitting diode display device is driven at a low voltage, which reduces power consumption, which is an advantageous feature of the organic light emitting diode display device. Also, the organic light emitting diode display device has excellent color expression ability, a high response speed, a wide viewing angle, and a high contrast ratio (CR). Therefore, the organic light emitting diode display device has been researched as a next-generation display device.

Light emitted from an organic emission layer of the organic light emitting diode generally passes through various elements in the organic light emitting diode display device to the outside. However, a part of the light emitted from the organic emission layer may not be transmitted to the outside of the organic light emitting diode display device but may be confined within the organic light emitting diode display device, which reduces the light extraction efficiency of the organic light emitting diode display device.

For example, in a bottom-emission organic light emitting diode display device, about 50% of the light emitted form an organic emission layer is confined within the organic light emitting diode display device due to total reflection or light absorption at an anode electrode, and about 30% of the light emitted from the organic emission layer is confined within the organic light emitting diode display device due to total reflection or light absorption at a substrate.

As such, about 80% of the light emitted from the organic emission layer is confined within the organic light emitting diode display device and only about 20% of the light is transmitted to the outside. Thus, the organic light emitting diode display device has low luminous efficiency.

In order to improve the light extraction efficiency of the organic light emitting diode display device, a method of forming a micro lens array (MLA) on an overcoating layer of the organic light emitting diode display device has been developed. However, even if the micro lens array is formed on the overcoating layer of the organic light emitting diode display device, a large amount of light is confined within the device, and only a small amount of light is transmitted to the outside.

Further, because the micro lens array is formed on the overcoating layer, emission areas of the organic light emitting diode display device may differ in luminous efficiency. Thus, a bright image may be formed in an area with a high luminous efficiency, and a dark image maybe formed in an area with a low luminous efficiency.

Accordingly, there has been a demand for an organic light emitting diode display device that can improve luminous efficiency.

SUMMARY

An aspect of the present disclosure provides an organic light emitting diode display device that can minimize a difference in brightness between emission areas of the organic light emitting diode display device and improve light extraction efficiency.

According to an aspect of the present disclosure, there is provided an organic light emitting diode display device including a substrate divided into an emission area and a non-emission area, an overcoating layer disposed on the substrate and including a plurality of micro lenses, a plurality of first electrode patterns disposed on the overcoating layer and spaced away from each other in the emission area, an organic emission layer disposed on the plurality of the first electrodes, and a second electrode disposed on the organic emission layer.

Herein, in an area where the micro lens is disposed, the organic light emitting diode display device may be divided into a first area, a second area, and a third area depending on the thickness of the organic emission layer. In this case, the first area corresponds to a recessed area of the micro lens, the second area corresponds to a slope of the micro lens, and the third area corresponds to a protruding area of the micro lens.

Further, the plurality of first electrode patterns may be disposed only in the second area and the third area of the organic light emitting diode display device. In this case, the second area and the third area may be emission areas of the organic light emitting diode display device and the first area may be a non-emission area.

In another aspect of the present disclosure, the plurality of first electrode patterns may be disposed only in the third area of the organic light emitting diode display device. In this case, the third area may be an emission area of the organic light emitting diode display device and the first area and the second area may be non-emission areas of the organic light emitting diode display device.

According to another aspect of the present disclosure, an organic light emitting diode display device includes a substrate, an overcoating layer, a first electrode pattern, an organic emission layer and a second electrode. The overcoating layer is disposed on the substrate and includes a plurality of micro lenses, and each of the micro lenses includes a recess. The first electrode pattern is disposed on the overcoating layer and has at least one opening corresponding to the recess. The organic emission layer is disposed on the substrate. The second electrode is disposed on the organic emission layer, and the organic emission layer is disposed between the first electrode pattern and the second electrode.

In one aspect of the present disclosure, the organic light emitting diode display device has a first area, a second area, and a third area, and each of the micro lenses further includes a protrusion and a slope. The first area corresponds to the recess, the second area corresponds to the slope, and the third area corresponds to the protrusion.

In one aspect of the present disclosure, the organic emission layer in a direction perpendicular to the slope in the second area has a smaller thickness than the organic emission layer disposed in the first area and the third area.

In one aspect of the present disclosure, the organic emission layer of the organic light emitting diode is disposed in contact with the overcoating layer in an area corresponding to the recess.

In one aspect of the present disclosure, each of the plurality of micro lenses further includes a protrusion and a slope, and the first electrode pattern is disposed in an area corresponding to the protrusion.

In one aspect of the present disclosure, the area corresponding to the protrusion is an emission area, and an area corresponding to the slope and the recess is a non-emission area.

In one aspect of the present disclosure, the organic emission layer of the organic light emitting diode is disposed in contact with the overcoating layer in an area corresponding to the recess and the slope.

In one aspect of the present disclosure, the overcoating layer is exposed at at least one opening.

In one aspect of the present disclosure, the first electrode pattern includes at least two convex portions spaced away from each other by at least one opening.

In one aspect of the present disclosure, an organic light emitting diode includes a first electrode pattern, an organic emission layer and a second electrode. The first electrode pattern has at least one opening. The organic emission layer is disposed on the first electrode pattern. The second electrode is disposed on the organic emission layer, and the organic emission layer is disposed between the first electrode pattern and the second electrode.

In the organic light emitting diode display device according to the present disclosure, the plurality of first electrode patterns is spaced away from each other in an organic light emitting diode disposed on the overcoating layer including the plurality of micro lens. Thus, the organic light emitting diode display device can minimize a difference in brightness between emission areas and improve light extraction efficiency.

In another aspect of the present disclosure, the plurality of micro lens may be formed in various shapes, and the plurality of first electrode patterns may be spaced away from each other. Thus, the organic light emitting diode display device can minimize a difference in brightness between the emission areas and improve light extraction efficiency.

BRIEF DESCRIPTION OF THE DRAWINGS

The above and other aspects, features and other advantages of the present disclosure will be more clearly understood from the following detailed description taken in conjunction with the accompanying drawings, in which:

FIG. 10 is a table comparing light extraction efficiency of the organic light emitting diode display device according to an exemplary embodiment of the present disclosure and the organic light emitting diode display device according to Comparative Example.

DETAILED DESCRIPTION OF THE EMBODIMENT

Figure 1:
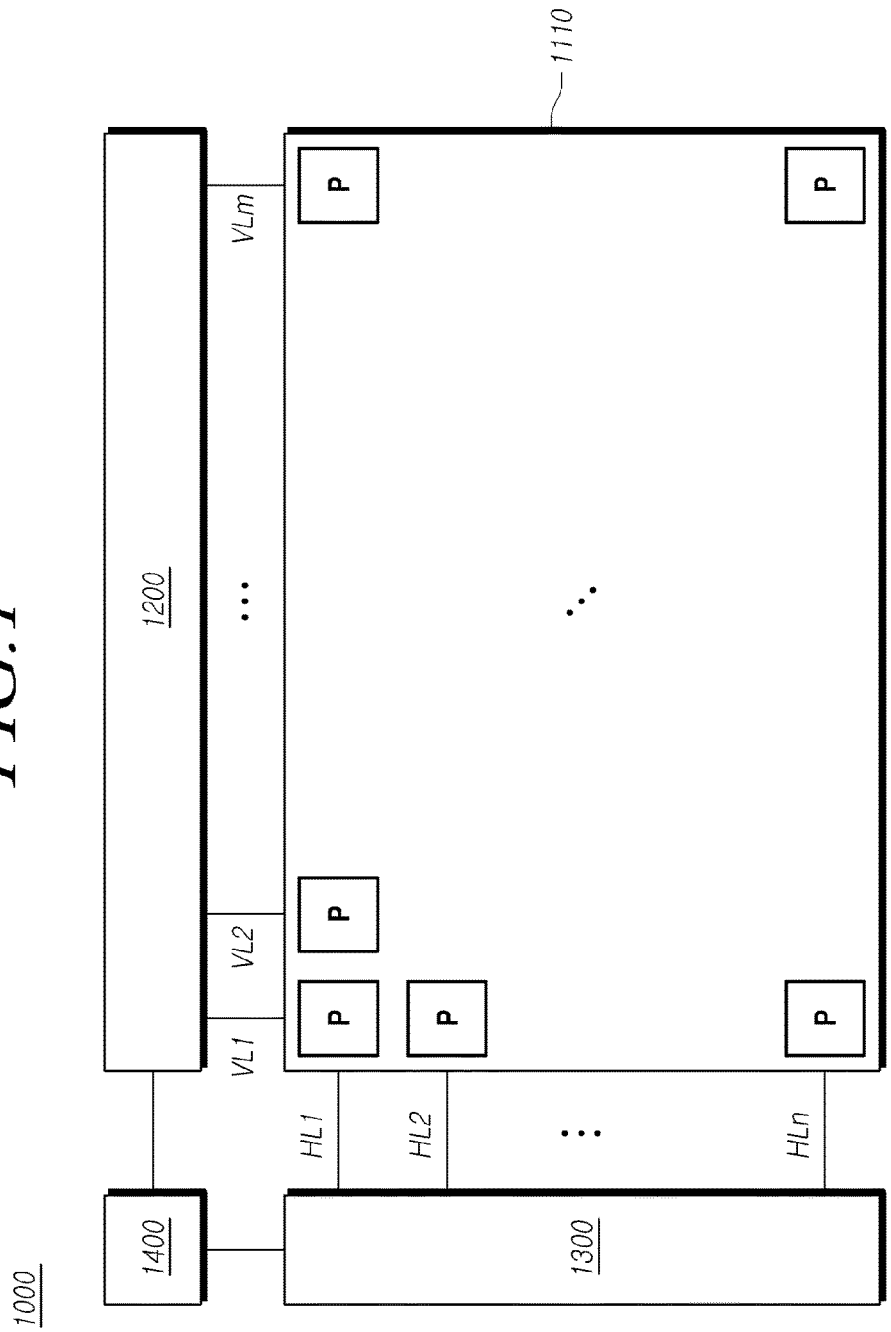
FIG. 1 is a schematic diagram illustrating a display device according to an exemplary embodiment of the present disclosure.

Hereinafter, exemplary embodiments of the present disclosure will be described in detail with reference to the accompanying drawings. The exemplary embodiments introduced hereinafter are provided as examples in order to convey their spirits to a person having ordinary skill in the art. Therefore, the present disclosure is not limited to the following exemplary embodiments and can be embodied in different shapes and different arrangements. Also, the size and thickness of the device might be exaggerated for the sake of convenience in the drawings. Like reference numerals generally denote like elements throughout the present specification.

Advantages and features of the present disclosure, and methods for accomplishing the same will be more clearly understood from exemplary embodiments described below with reference to the accompanying drawings. The exemplary embodiments are provided only to complete disclosure of the present disclosure and to fully provide a person having ordinary skill in the art to which the present disclosure pertains with the category of the disclosure, and the present disclosure will be defined by the appended claims.

When an element or layer is referred to as being "on" another element or layer, it may be directly on the other element or layer, or intervening elements or layers may be present. Meanwhile, when an element is referred to as being "directly on" another element, any intervening elements may not be present.

The spatially-relative terms such as "below", "beneath", "lower", "above", and "upper" may be used herein for ease of description to describe the relationship of one element or components with another element(s) or component(s) as illustrated in the drawings. It will be understood that the spatially relative terms are intended to encompass different orientations of the element in use or operation, in addition to the orientation depicted in the drawings. For example, if the element in the drawings is turned over, elements described as "below" or "beneath" other elements would then be oriented "above" the other elements. Thus, the exemplary term "below" can encompass both an orientation of above and below.

Further, in describing components of the present disclosure, terms such as first, second, A, B, (a), and (b) can be used. These terms are used only to differentiate the components from other components. Therefore, the nature, order, sequence, and the like of the corresponding components are not limited by these terms.

FIG. 1 is a schematic diagram illustrating a display device according to an exemplary embodiment of the present disclosure. Referring to FIG. 1, a display device 1000 according to exemplary embodiments includes a display panel 1100 on which a plurality of first lines VL1 to VLm are formed in a first direction, i.e. a vertical direction, and a plurality of second lines HL1 to HLn are formed in a second direction, i.e. a horizontal direction, a first driver 1200 configured to supply a first signal to the plurality of first lines VL1 to VLm, a second driver 1300 configured to supply a second signal to the plurality of second lines HL1 to HLn, and a timing controller 1400 configured to control the first driver 1200 and the second driver 1300.

On the display panel 1100, a plurality of pixels P are defined by intersection between the plurality of first lines VL1 to VLm formed in the first direction and the plurality of second lines HL1 to HLn formed in the second direction.

Each of the first driver 1200 and the second driver 1300 may include at least one driver integrated circuit (IC) configured to output a signal for displaying an image.

The plurality of first lines VL1 to VLm formed in the first direction on the display panel 1100 may be, for example, data lines configured to transfer a data voltage (first signal) to a vertical column of pixels, and the first driver 1200 may be, for example, a data driver configured to supply the data voltage to the data lines.

Further, the plurality of second lines HL1 to HLn formed in the second direction on the display panel 1100 may be, for example, gate lines formed in the horizontal direction and configured to transfer a scan signal (first signal) to a horizontal column of pixels, and the second driver 1300 may be, for example, a gate driver configured to supply the scan signal to the gate lines.

The display panel 1100 may further include a pad in order to be connected to the first driver 1200 and the second driver 1300. If the first driver 1200 supplies the first signal to the plurality of first lines VL1 to VLm, the pad transfers the first signal to the display panel 1100, and if the second driver 1300 supplies the second signal to the plurality of second lines HL1 to HLn, the pad transfers the second signal to the display panel 1100.

Each pixel includes one or more subpixels. The subpixel refers to a unit in which a specific kind of color filter is formed, or in which a color filter is not formed but an organic light emitting diode emits a light of a specific color. Herein, colors to be defined in the subpixels may include red (R), green (G), blue (B), and optionally white (W), but the present disclosure is not limited thereto. Each subpixel includes a separated thin-film transistor and an electrode connected thereto, and, thus, hereinafter, a subpixel will also be referred to as a pixel area. A first line may be disposed in each subpixel, and a plurality of subpixels constituting a pixel may share a specific first line. The configuration of a pixel/subpixel and a first line/second line can be modified in various ways, and the present disclosure is not limited thereto.

An electrode connected to a thin-film transistor and configured to control emission of each pixel area on the display panel 1100 will be referred to as a first electrode, and an electrode disposed on the entire surface of the display panel or disposed to include two or more pixel areas will be referred to as a second electrode.

If the first electrode is an anode electrode, the second electrode is a cathode electrode, and vice versa. In the following, the first electrode will be described as an anode electrode and the second electrode will be described as a cathode electrode in an exemplary embodiment, but the present disclosure is not limited thereto.

Further, in the organic light emitting diode display device according to exemplary embodiments of the present disclosure, three or four subpixels may constitute one pixel. Furthermore, a color filter of a single color may be disposed on one pixel, or a color filter may not be disposed on at least one of subpixels constituting the one pixel. The color filter can convert a color of a single organic emission layer into a color having a specific wavelength.

Moreover, each subpixel includes a light-scattering layer in order to improve light extraction efficiency of the organic emission layer. The light-scattering layer may be referred to as a micro lens array, a nano pattern, a diffusion pattern, silica beads, or the like.

In the following, the light-scattering layer will be described as a micro lens array, but exemplary embodiments of the present disclosure are not limited thereto. In the exemplary embodiments of the present disclosure, various structures capable of scattering lights may be combined and applied.

Figure 2:
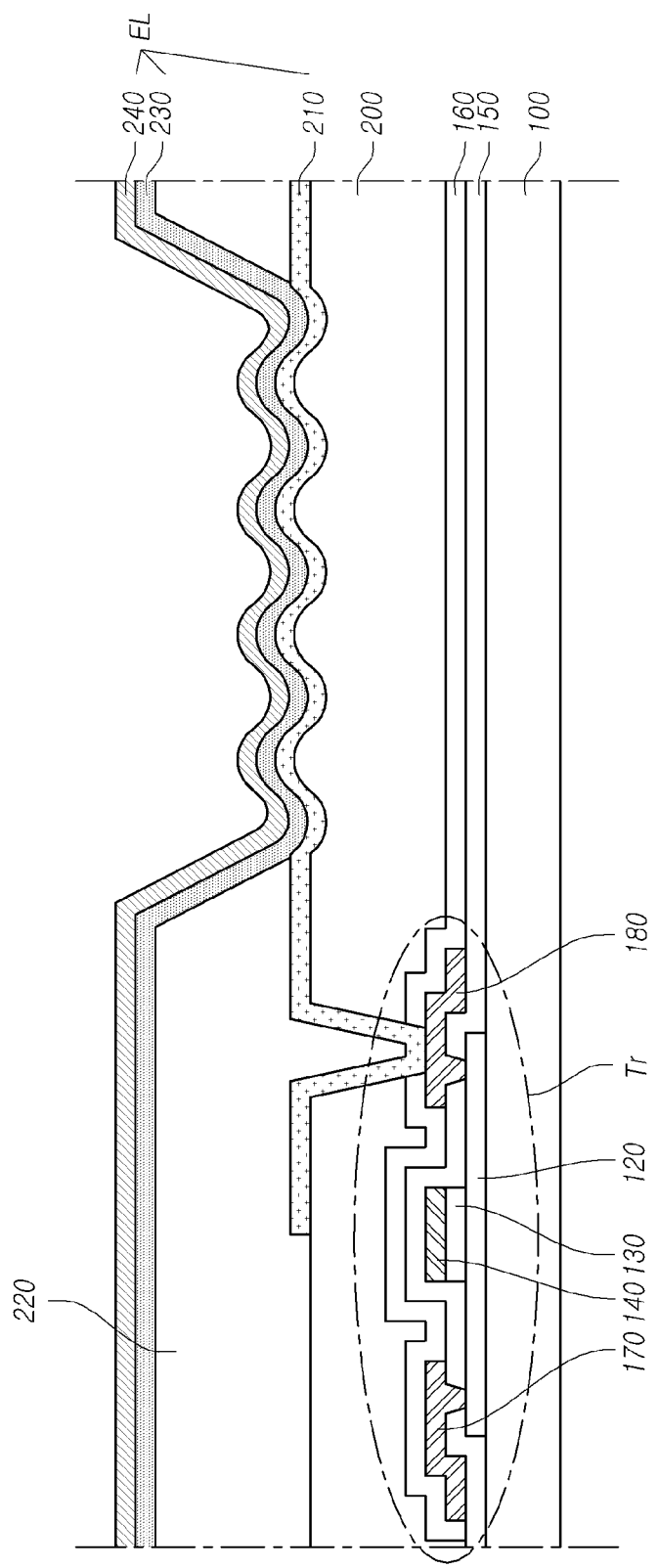
FIG. 2 is a cross-sectional view of an organic light emitting diode display device to which exemplary embodiments of the present disclosure can be applied.

FIG. 2 is a cross-sectional view of an organic light emitting diode display device to which exemplary embodiments of the present disclosure can be applied, including a thin-film transistor Tr and an organic light emitting diode EL electrically connected to the thin-film transistor Tr.

The thin-film transistor Tr includes an active layer 120, a gate electrode 140, a source electrode 170, and a drain electrode 180. Further, the organic light emitting diode EL includes a first electrode 210, an organic emission layer 230, and a second electrode 240.

Specifically, the active layer 120 of the thin-film transistor Tr is disposed on a substrate 100. A gate insulation film 130 and a gate electrode 140 are disposed on the active layer 120. An interlayer insulation film 150 is disposed on the gate electrode 140.

Further, the source electrode 170 and the drain electrode 180 are disposed to be in contact with the active layer 120 through a contact hole formed in the interlayer insulation film 150 are disposed on the interlayer insulation film 150. A protective layer 160 is disposed on the source electrode 170 and the drain electrode 180. The organic light emitting diode display device to which exemplary embodiments of the present disclosure can be applied is not limited to FIG. 2. The organic light emitting diode display device to which exemplary embodiments of the present disclosure can be applied may further include a buffer layer (not shown) disposed between the substrate 100 and the active layer 120.

Further, an overcoating layer 200 is disposed on the protective layer 160. The first electrode 210 of the organic light emitting diode EL connected to the drain electrode 180 of the thin-film transistor Tr is disposed on the overcoating layer 200. Further, a bank pattern 220 is disposed on the overcoating layer 200 so as to expose a part of a top surface of the first electrode 210. The organic emission layer 230 is disposed on the bank pattern 220 and the top surface of the first electrode 210 exposed by the bank pattern 220.

Herein, the organic emission layer 230 may be disposed only on the top surface of the first electrode 210 exposed by the bank pattern 220, or may be disposed on the first electrode 210 and the bank pattern 220. Further, the second electrode 240 of the organic light emitting diode EL is disposed to be overlapped with the organic emission layer 230 and the bank pattern 220.

Further, although not illustrated in the drawing, a polarizing plate may be disposed on a rear surface of the substrate 100. The polarizing plate may be a polarizing plate having a polarization axis in a certain direction and configured to transmit only a light having an axis in the same direction as the polarization axis when the amount of lights is emitted from the rear surface of the substrate 100.

The polarizing plate may be formed as a single layer or a multilayer. Further, the polarizing plate has been described as having a polarization axis in a certain direction, but exemplary embodiments of the present disclosure are not limited thereto. The polarizing plate may further include a phase retardation film.

Further, although not illustrated in FIG. 2, a color filter layer disposed on the protective layer 160 may be further included in the organic light emitting diode display device to which exemplary embodiments of the present disclosure can be applied. Herein, the color filter layer may be disposed only on some of the plurality of subpixels.

Further, although FIG. 2 illustrates a bottom-emission type organic light emitting diode display device, exemplary embodiments of the present disclosure may be applied to a top-emission or dual-emission organic light emitting diode display device, if necessary.

In order to improve light extraction efficiency of the above-described organic light emitting diode display device, an overcoating layer may be provided on which a micro lens including a plurality of recesses and a plurality of protrusions may be formed.

In this case, when light is incident on an interface between the micro lens and the first electrode 210 of the organic light emitting diode, light having an incidence angle equal to or lower than a total reflection critical angle is extracted to the outside of the substrate 100 without modification. Further, light having an incident angle higher than the total reflection critical angle may collide with the micro lens, thereby changing the path of the light before being extracted to the outside of the substrate 100.

Accordingly, the light extraction efficiency of the organic light emitting diode display device to which the micro lens is applied can be improved. However, there may be a difference in light extraction efficiency between emission areas.

Figure 3A:
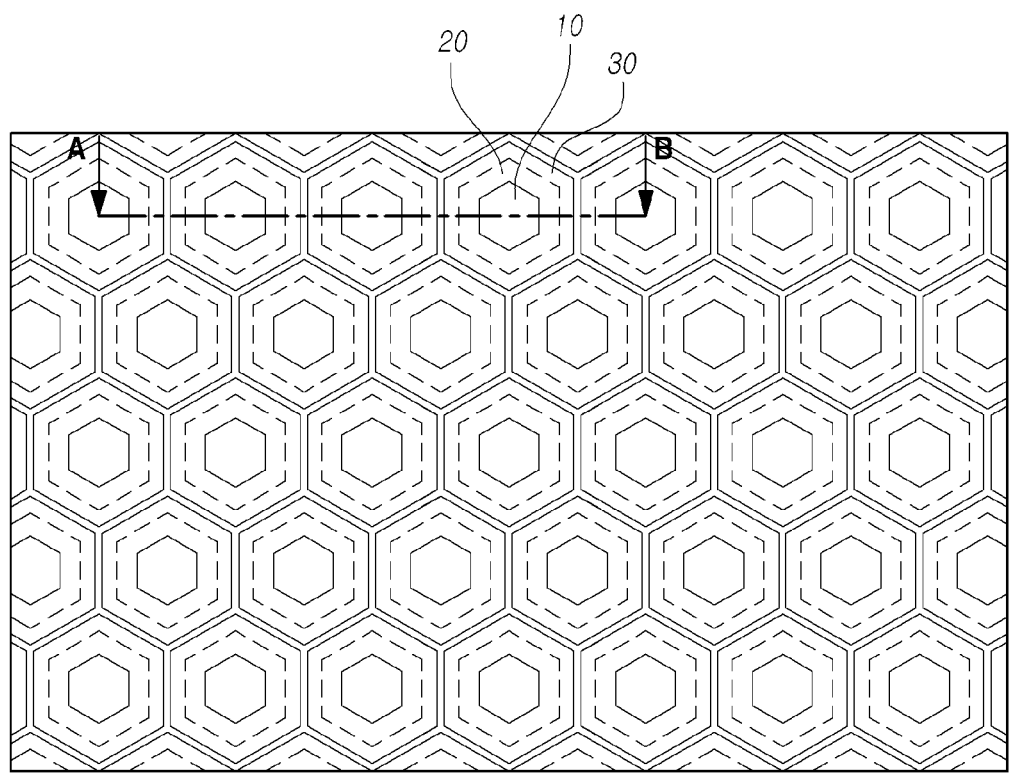
FIG. 3A is a plan view of an organic light emitting diode display device to which a micro lens is applied.
Figure 3B:
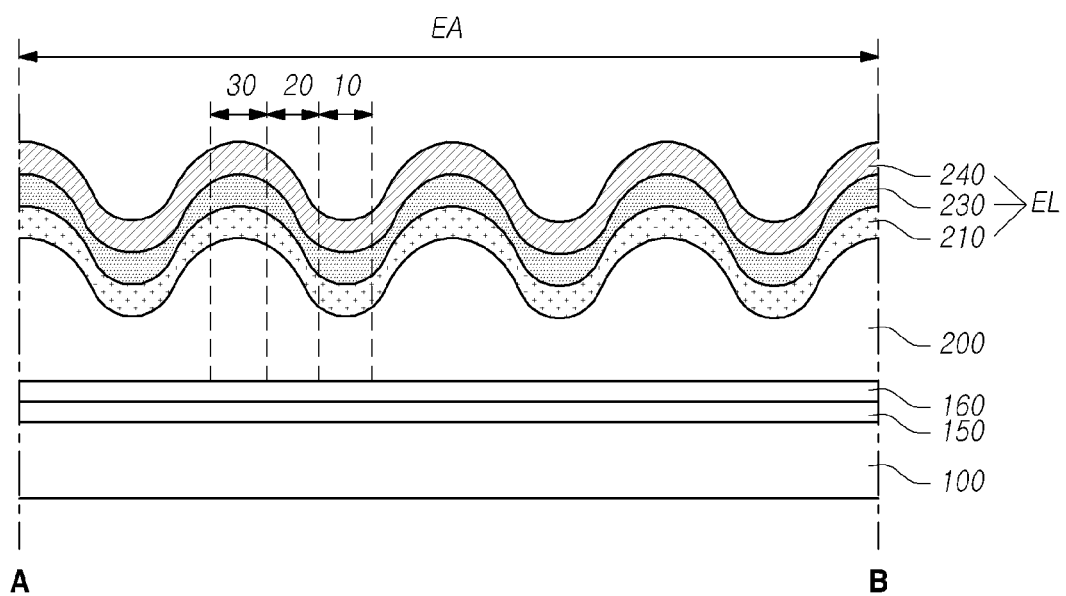
FIG. 3B is a cross-sectional view taken along a line A-B of the organic light emitting diode display device of FIG. 3A.

Details thereof will be described below with reference to FIG. 3A and FIG. 3B. FIG. 3A is a plan view of an organic light emitting diode display device to which a micro lens is applied. FIG. 3B is a cross-sectional view taken along a line A-B of the organic light emitting diode display device of FIG. 3A. Herein, description of the components identical to those of FIG. 2 may be omitted and redundant description may also be omitted.

Referring to FIG. 3A and FIG. 3B, the organic light emitting diode display device is divided into a first area 10, a second area 20, and a third area 30 depending on the thickness of the organic emission layer 230 of the organic light emitting diode EL. Herein, the first area 10, the second area 20, and the third area 30 may be included in an emission area EA of the organic light emitting diode display device.

The organic emission layer 230 of the organic light emitting diode EL disposed in the second area 20 may have a smaller thickness than the organic emission layer 230 disposed in the first area 10 and the third area 30. Specifically, since the organic emission layer 230 is formed by a deposition method having straightness, the organic emission layer 230 in the second area 20 corresponding to a slope may have a smaller thickness than the organic emission layer 230 in the first area 10 and the third area 30 in a direction perpendicular to the slope in the second area 20.

In other words, the second area 20 may be an area corresponding to a slope of a plurality of micro lenses formed on the overcoating layer 200. Further, each of the first area 10 and the third area 30 may be an area except the area corresponding to the slope of the plurality of micro lenses. Herein, the first area 10 corresponds to a recessed area (recess) of a micro lens, and the third area 30 corresponds to a protruded area (protrusion) of the micro lens.

In the organic light emitting diode display device to which the micro lens is applied, the first area 10, the second area 20, and the third area 30 may be alternately disposed in the emission area EA.

Meanwhile, since the organic emission layer 230 has a small thickness in the second area 20, the organic light emitting diode EL mainly emits light in the second area 20. Further, most of the light transmitted from the slope is incident on the other areas of the micro lenses, and is multiply reflected to decrease the incidence angle at the interface of the substrate, such that the incident angle is lower than the total reflection critical angle, thereby preventing total internal reflection. Thus, the light extraction efficiency can be increased. Furthermore, the organic emission layer 230 has the smallest thickness in the second area 20 and thus has a high current density. Therefore, the organic light emitting diode EL may have a high luminous efficiency in the second area 20.

Moreover, the organic emission layer 230 in the third area 30 corresponding to a protruded area of the micro lens has a greater thickness than the organic emission layer 230 on the slope of the micro lens and thus has a low current density. However, light extraction efficiency is high in the third area 30 due to the micro lens because the emission layer in the third area 30 also has a smaller thickness than the thickness thereof in the first area 10.

Accordingly, an image in the second area 20 and the third area 30 may be observed as being brighter than an image in the first area 10.

Hereinafter, the following exemplary embodiments of the present disclosure are provided to solve the above-described problem, where the organic light emitting diode display device has a plurality of first electrode patterns disposed spaced away from each other on an overcoating layer including a plurality of micro lenses. Thus, brightness is uniform across an emission area and light extraction efficiency can be further increased.

Figure 4:
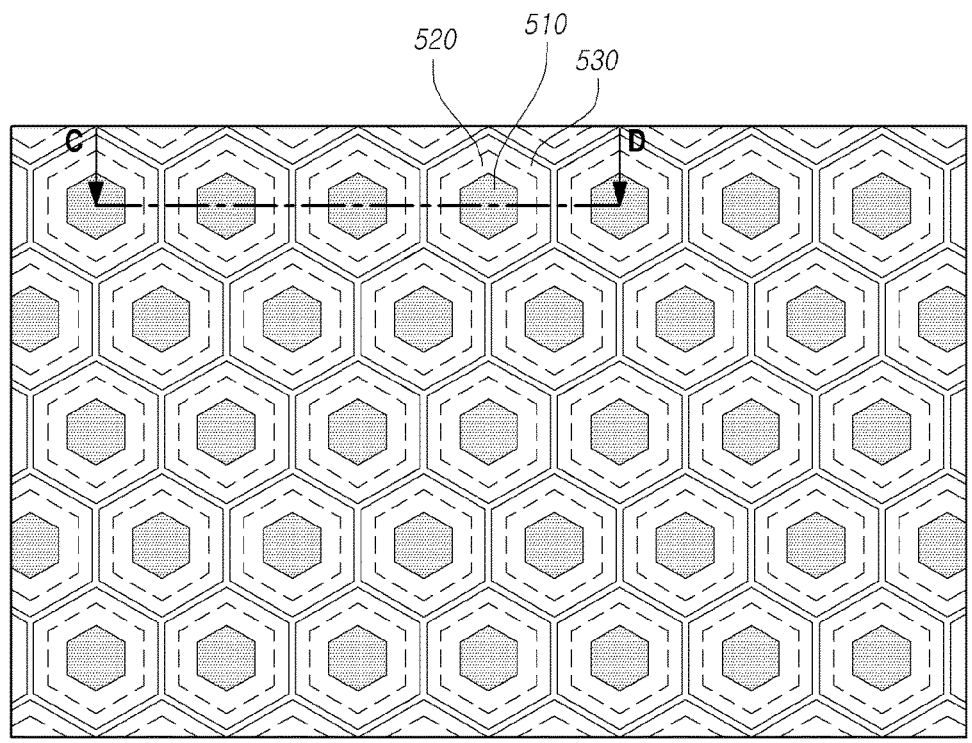
FIG. 4 is a plan view illustrating an area where a micro lens is disposed in an organic light emitting diode display device according to an exemplary embodiment of the present disclosure.

FIG. 4 is a plane view illustrating a part of an area where a micro lens is disposed in an organic light emitting diode display device according to an exemplary embodiment of the present disclosure. Referring to FIG. 4, each area where a micro lens is disposed may have a hexagonal shape in a plan view, and the plurality of areas where a plurality of micro lenses may be disposed may be formed into a hexagonal honeycomb structure in a plan view.

However, the area where a micro lens is disposed in the organic light emitting diode display device according to an exemplary embodiment of the present disclosure is not limited thereto, and may have various shapes such as an overall hemispheric shape, semi-elliptical shape or square shape.

Further, the area where a micro lens is disposed may be divided into a first area 510, a second area 520, and a third area 530 depending on the thickness of the organic emission layer of an organic light emitting diode. Herein, a first electrode of the organic light emitting diode may be disposed only in the first area 510 and the second area 520. That is, the first electrode may not be disposed in the third area 530. Therefore, the first area 510 and the second area 520 may be emission areas and the third area 530 may be a non-emission area.

Figure 5:
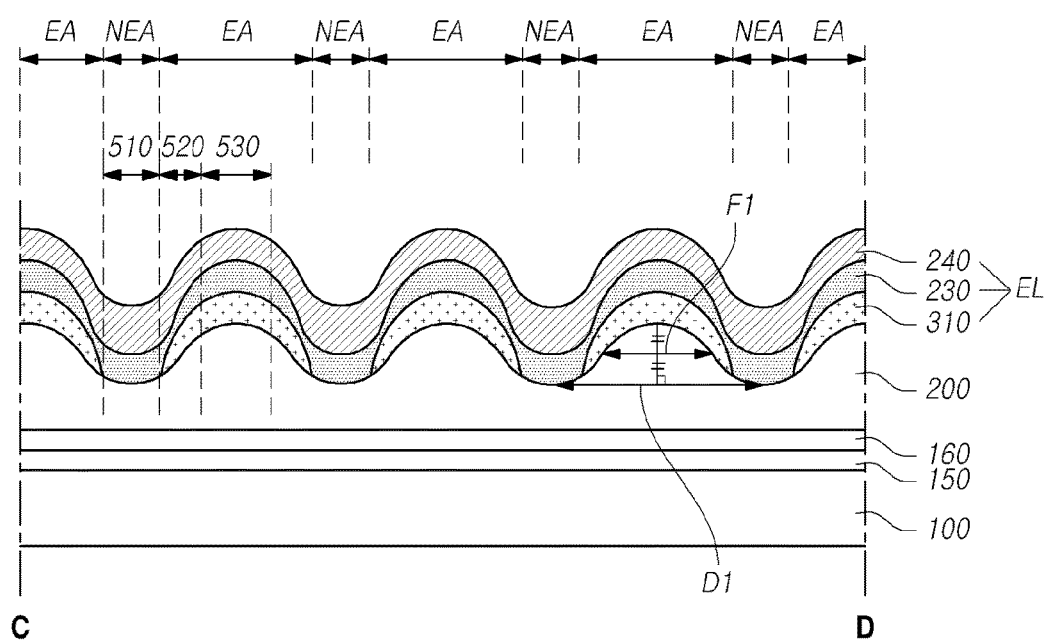
FIG. 5 is a cross-sectional view taken along a line C-D of the organic light emitting diode display device of FIG. 4.

This configuration will be described below in detail with reference to FIG. 5. FIG. 5 is a cross-sectional view taken along a line C-D of the organic light emitting diode display device of FIG. 4. Referring to FIG. 5, in the organic light emitting diode display device according to an exemplary embodiment of the present disclosure, a plurality of insulation layers 150 and 160 are disposed on the substrate 100 and the overcoating layer 200 including a plurality of micro lenses is disposed on the insulation layer 160. A maximum width of the micro lens is designated D1 and the full width at half maximum of the micro lens is designated F1, as illustrated in FIG. 5. Herein, the maximum width and the full width at half maximum of the micro lens may be defined as a width of the protrusion of the micro lens at the position corresponding to half the height of the micro lens. The overcoating layer, for example, is made of photoresist material. The full width at half maximum of the micro lens may be determined by an exposure amount of light irradiated to the overcoating layer and a material of the overcoating layer during a process of forming the micro lens.

The organic light emitting diode EL including a plurality of first electrode patterns 310, the organic emission layer 230, and the second electrode 240 is disposed on the plurality of micro lenses. Herein, the first electrode patterns 310, the organic emission layer 230, and the second electrode 240 may be formed according to the morphology of the micro lenses.

Herein, the first electrode pattern 310 may be disposed only in the second area 520 corresponding to a slope of a micro lens and the third area 530 corresponding to a protruded area of the micro lens. That is, the first electrode pattern 310 may not be disposed in the first area 510 corresponding to a recessed area of the micro lens.

Specifically, the organic emission layer 230 of the organic light emitting diode EL disposed on the micro lens in the first area 510 has a greater thickness and thus has a low current density. Further, most of the light incident on the recessed area of the micro lens has an incident angle higher than the total reflection critical angle in the first area 510. Thus, a small amount of light is multi-reflected by the micro lens. Therefore, light extraction efficiency is decreased in the first area 510.

The organic light emitting diode display device according to an exemplary embodiment of the present disclosure includes an area where the first electrode pattern 310 is not disposed in the first area 510. Thus, a current does not flow in the first area 510. That is, the organic emission layer 230 and the overcoating layer 200 may be disposed in contact with each other in the first area 510. Therefore, a greater amount of current flows in the second area 520 and the third area 530.

According to an exemplary embodiment of the present disclosure, the first electrode pattern 310 has at least one opening corresponding to the recess (recessed area) of the micro lens. As shown in FIG. 5, a plurality of openings may be present, and a part of the overcoating layer 200 may be exposed at the plurality of openings to be in contact with the organic emission layer 230.

In another exemplary embodiment of the present disclosure, the first electrode pattern 310 may include at least two convex portions spaced away from each other by the at least one opening. As shown in FIG. 5, a plurality of both the at least two convex portions and the at least one opening may be present. The convex portions may be located on the second area 520 corresponding to the slope of the micro lens and the third area 530 corresponding to the protrusion of the micro lens. In one of the micro lenses, the convex portions are spaced away from each other by the opening located on the first area 510.

Accordingly, a current density increases in the second area 520 and the third area 530, and thus, the light extraction efficiency in the second area 520 and the third area 530 increases.

An area where the first electrode pattern 310 is not disposed may be a non-emission area NEA of the organic light emitting diode display device, and an area where the first electrode pattern 310 is disposed may be an emission area EA of the organic light emitting diode display device. Therefore, since the first electrode pattern 310 is not disposed in the first area 510 having a lower brightness than the second area 520 and the third area 530, a difference in brightness between the emission areas EA can be minimized. That is, in the organic light emitting diode display device according to an exemplary embodiment of the present disclosure, the first electrode pattern 310 is not disposed in the first area 510 having low current density and light extraction efficiency, and, thus, there is an effect of increasing light extraction efficiency in the second area 520 and the third area 530.

Figure 6:
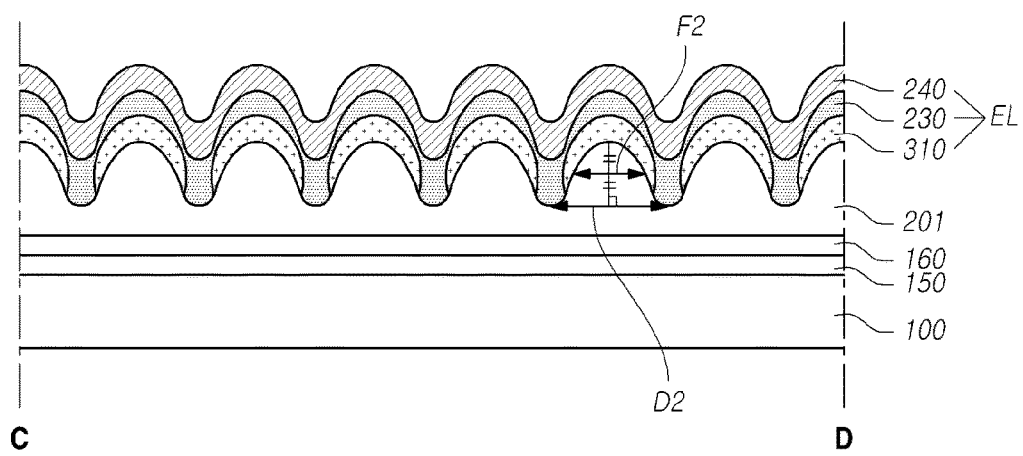
FIG. 6 is a diagram illustrating a micro lens and an organic light emitting diode according to another exemplary embodiment.

Further, the micro lens of the organic light emitting diode display device according to the present disclosure is not limited to the micro lens illustrated in FIG. 5, but may be formed in a shape illustrated in FIG. 6. FIG. 6 is a diagram illustrating a micro lens and an organic light emitting diode according to another exemplary embodiment.

Referring to FIG. 6, a maximum width D2 of a micro lens formed on an overcoating layer 201 is smaller than a maximum width D1 of the micro lens illustrated in FIG. 5. Therefore, a full width at half maximum (FWHM) F2, which is a width of a protrusion of the micro lens at a position corresponding to half the height of the micro lens, may also be smaller than a full width at half maximum F1 of the micro lens illustrated in FIG. 5.

Since the maximum width D2 and the full width at half maximum F2 of the micro lens are decreased, the slope of the micro lens is steep. Thus, a thickness of the organic emission layer 230 formed on the slope may be further decreased. Therefore, the organic emission layer 230 may have a smaller thickness in the second area 520 corresponding to the slope of the micro lens.

Accordingly, the first area 510 may have a lower light extraction efficiency than the second area 520 and the third area 530. Meanwhile, as illustrated in FIG. 6, even if the maximum width D2 and the full width at half maximum F2 of the micro lens are decreased, the plurality of first electrode patterns 310 of the organic light emitting diode EL may be disposed as being spaced away from each other.

Accordingly, a greater amount of current flows in the second area 520 and the third area 530, and the light extraction efficiency can be further improved in the second area 520 and the third area 530.

Figure 7:
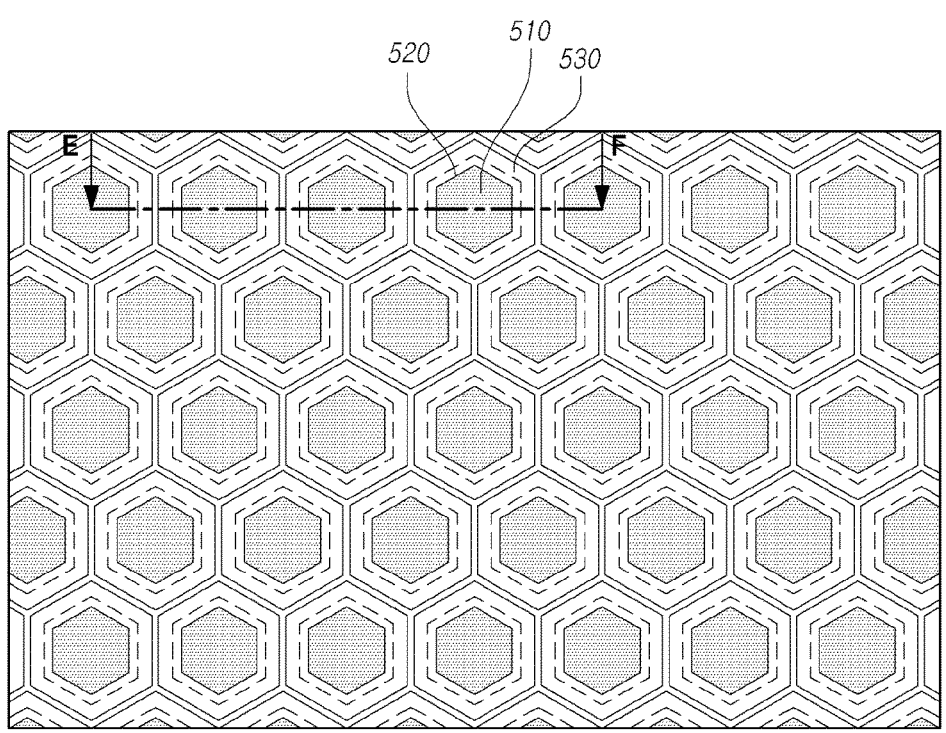
FIG. 7 is a plan view illustrating an area where a micro lens is disposed in an organic light emitting diode display device according to yet another exemplary embodiment of the present disclosure.
Figure 8:
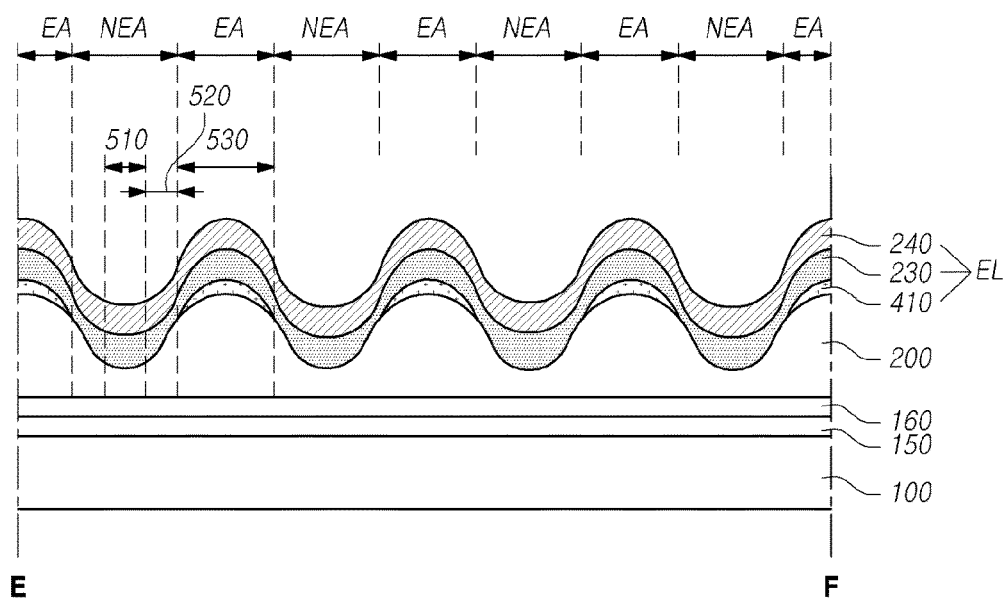
FIG. 8 is a cross-sectional view taken along a line E-F of the organic light emitting diode display device of FIG. 7.

Hereinafter, an organic light emitting diode display device according to yet another exemplary embodiment of the present disclosure will be described with reference to FIG. 7 and FIG. 8. FIG. 7 is a plan view illustrating a part of an area where a micro lens is disposed in the organic light emitting diode display device. FIG. 8 is a cross-sectional view taken along a line E-F of the organic light emitting diode display device of FIG. 7.

First, referring to FIG. 7, the area where the micro lens is disposed may be divided into the first area 510, the second area 520, and the third area 530 depending on a thickness of an organic emission layer of an organic light emitting diode. Herein, a first electrode of the organic light emitting diode may be disposed only in the third area 530.

That is, the first electrode is not disposed in the first area 510 and the second area 520. Therefore, the third area 530 may be an emission area and the first area 510 and the second area 520 may be non-emission areas.

This configuration will be described below in detail with reference to FIG. 8. In FIG. 8, a first electrode pattern 410 may be disposed only in the third area 530 corresponding to the protruded area of the micro lens formed on the overcoating layer 200.

That is, the first electrode pattern 410 may not be disposed in the first area 510 corresponding to the recessed area of the micro lens and the second area 520 corresponding to the slope of the micro lens. Herein, since the first electrode pattern 410 is not disposed in the first area 510 and the second area 520, the organic emission layer 230 of the organic light emitting diode EL may be disposed in contact with the overcoating layer 200 in the first area 510 and the second area 520.

Specifically, the organic emission layer 230 disposed in the third area 530 has a greater thickness than the organic emission layer 230 disposed in the second area 520 and thus has a relatively low current density. However, the third area 530 has a higher light extraction efficiency than the first area 510 and the second area 520. Thus, since the first electrode pattern 410 is formed only in the third area 530, the current density of the third area 530 can be increased and the light extraction efficiency can be maximized.

In other words, since the first electrode pattern 410 is not disposed in the first area 510 and the second area 520, current may flow and concentrate in the organic light emitting diode EL disposed in the third area 530, thereby increasing the current density of the organic light emitting diode EL disposed in the third area 530 and increasing the light extraction efficiency.

Meanwhile, an area where the first electrode pattern 410 is not disposed may be a non-emission area NEA of the organic light emitting diode display device, and an area where the first electrode pattern 410 is disposed may be an emission area EA of the organic light emitting diode display device. Therefore, since the first electrode pattern 410 is not disposed in the first area 510 and the second area 520, only the third area 530 having the highest light extraction efficiency may be the emission area EA. Thus, a difference in brightness between emission areas EA can be suppressed.

That is, in the organic light emitting diode display device according to yet another exemplary embodiment of the present disclosure, the first electrode pattern 410 is not disposed in the first area 510, which has lower current density and light extraction efficiency than the third area 530, and the second area 520, which has a lower light extraction efficiency than the third area 530. Thus, the light extraction efficiency in the third area 530 increases.

Figure 9:
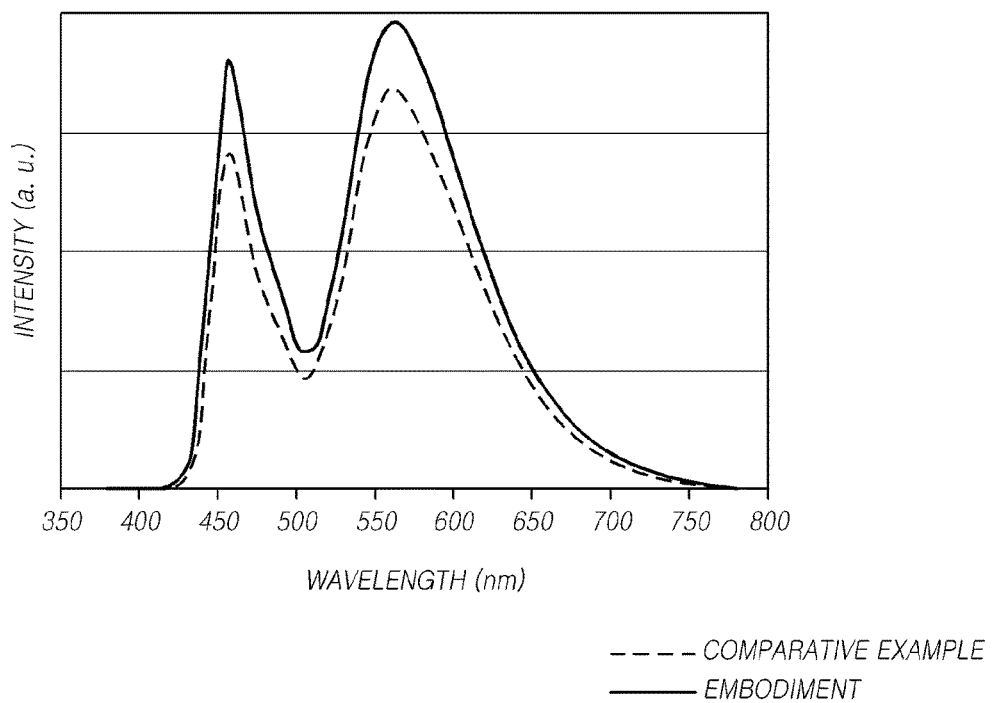
FIG. 9 is a graph illustrating light extraction efficiency as a function of wavelength of an organic light emitting diode display device according to an exemplary embodiment of the present disclosure and an organic light emitting diode display device according to Comparative Example.

This effect will be described below with reference to FIG. 9 and FIG. 10. FIG. 9 is a graph illustrating light extraction efficiency depending on wavelength in an organic light emitting diode display device according to an exemplary embodiment of the present disclosure and an organic light emitting diode display device according to Comparative Example.

In the organic light emitting diode display device according to an exemplary embodiment of the present disclosure, a plurality of micro lenses is formed on an overcoating layer and a first electrode pattern of an organic light emitting diode is not disposed in an area corresponding to a recessed area of the micro lens. In comparison, in an organic light emitting diode display device according to the Comparative Example, the plurality of micro lenses are formed on an overcoating layer, and the first electrode of an organic light emitting diode is disposed entirely on the micro lens.

Referring to FIG. 9, it can be seen that light in a visible light wavelength range generally have a higher intensity in the organic light emitting diode display device according to an exemplary embodiment of the present disclosure than in the organic light emitting diode display device according to Comparative Example. That is, the amount of light extracted in the visible light wavelength range is greater in the organic light emitting diode display device according to an exemplary embodiment of the present disclosure than in the organic light emitting diode display device according to Comparative Example.

FIG. 10 is a table comparing light extraction efficiencies of the organic light emitting diode display device according to an exemplary embodiment of the present disclosure and the organic light emitting diode display device according to Comparative Example.

Referring to FIG. 10, it can be seen that at almost the same driving voltage, the light extraction efficiency of the organic light emitting diode display device according to an exemplary embodiment of the present disclosure is 14% higher than that of the organic light emitting diode display device according to the Comparative Example.

As described above, in an organic light emitting diode display device according to exemplary embodiments of the present disclosure, a first electrode of an organic light emitting diode is not disposed in an area having low light extraction efficiency and current density or an area having a low light extraction efficiency. Thus, a current density can be further increased in an area having high light extraction efficiency and current density or an area having a high light extraction efficiency, and the overall light extraction efficiency can be maximized.

The features, structures, effects, and the like described in the above exemplary embodiments are included in at least one exemplary embodiment and but are not limited to one exemplary embodiment. In addition, the features, structures, effects, and the like described in the respective exemplary embodiments may be executed by those skilled in the art while being combined or modified with respect to other embodiments. Accordingly, it will be understood that contents related to the combination and modification of the exemplary embodiments are also included within the scope of the present disclosure.

Further, it should be understood that the exemplary embodiments described above should be considered as being descriptive alone and not for limiting the present disclosure. It will be understood by those skilled in the art that various other modifications and applications may be made therein without departing from the spirit and scope of the exemplary embodiments. For example, respective components shown in detail in the exemplary embodiments may be executed while being modified.

What is claimed is:

1. An organic light emitting diode display device comprising:
   a substrate;
   an overcoating layer disposed on the substrate and including a plurality of micro lenses, each of the plurality of micro lenses including a recess;

a first electrode pattern disposed on the overcoating layer and having at least one opening corresponding to the recess;

an organic emission layer disposed on the substrate; and a second electrode disposed on the organic emission layer, the organic emission layer being disposed between the first electrode pattern and the second electrode, wherein the organic emission layer is disposed in contact with the overcoating layer in an area corresponding to the recess.

2. The organic light emitting diode display device according to claim 1, wherein the organic light emitting diode display device has a first area, a second area and a third area, and each of the plurality of micro lenses further includes a protrusion and a slope, and wherein the first area corresponds to the recess, the second area corresponds to the slope, and the third area corresponds to the protrusion.

3. The organic light emitting diode display device according to claim 2, wherein the thickness of the organic emission layer in a direction perpendicular to the slope in the second area is smaller than the thickness of the organic emission layer disposed in the first area and the third area.

4. The organic light emitting diode display device according to claim 2, wherein the first electrode pattern is disposed in the second area and the third area of the organic light emitting diode display device.

5. The organic light emitting diode display device according to claim 2, wherein the second area and the third area are emission areas and the first area is non-emission area.

6. The organic light emitting diode display device according to claim 1, wherein each of the plurality of micro lenses further includes a protrusion and a slope, and the first electrode pattern is disposed in an area corresponding to the protrusion.

7. The organic light emitting diode display device according to claim 6, wherein the area corresponding to the protrusion is an emission area, and an area corresponding to the slope and the recess is a non-emission area.

8. The organic light emitting diode display device according to claim 6, wherein the organic emission layer of the organic light emitting diode is disposed in contact with the overcoating layer in an area corresponding to the recess and the slope.

9. The organic light emitting diode display device according to claim 1, wherein the overcoating layer is exposed at the at least one opening.

10. The organic light emitting diode display device according to claim 1, wherein the first electrode pattern includes at least two convex portions spaced apart from each other by the at least one opening.

11. The organic light emitting diode display device to claim 1, further comprising a thin-film transistor disposed on the substrate, and connected to the first electrode patterns, wherein the overcoating layer covers the thin-film transistor.

* * * * *